(12) United States Patent
Gupta (10) Patent No.: US 9,263,106 B2
(45) Date of Patent: Feb. 16, 2016

(54) EFFICIENT COMMAND MAPPING SCHEME FOR SHORT DATA BURST LENGTH MEMORY DEVICES

(75) Inventor: Alok Gupta, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/279,172

(22) Filed: Oct. 21, 2011

(65) Prior Publication Data

US 2013/0103917 A1    Apr. 25, 2013

(51) Int. Cl.
| G06F 12/00 | (2006.01) |
|---|---|
| G11C 7/10 | (2006.01) |
| G11C 7/22 | (2006.01) |
| G06F 13/28 | (2006.01) |

(52) U.S. Cl.
CPC ............... *G11C 7/109* (2013.01); *G06F 13/28* (2013.01); *G11C 7/22* (2013.01)

(58) Field of Classification Search
CPC .................................. G11C 7/22; G06F 13/28
USPC ........................................................ 711/167
See application file for complete search history.

(56) References Cited

U.S. PATENT DOCUMENTS

| 6,532,523 | B1 * | 3/2003 | Mogili ........................... 711/168 |
|---|---|---|---|
| 7,263,653 | B2 * | 8/2007 | Lee et al. ........................ 714/795 |
| 2005/0180249 | A1 * | 8/2005 | Kootstra ................... 365/230.03 |
| 2006/0184754 | A1 * | 8/2006 | Bellows et al. ................ 711/167 |
| 2007/0011376 | A1 * | 1/2007 | Gaskins ......................... 710/107 |
| 2008/0141252 | A1 * | 6/2008 | Luick ............................ 718/102 |
| 2008/0162852 | A1 * | 7/2008 | Kareenahalli et al. ......... 711/167 |
| 2008/0313364 | A1 * | 12/2008 | Flynn et al. ..................... 710/31 |

FOREIGN PATENT DOCUMENTS

| CN | 101568903 A | 10/2009 |
|---|---|---|
| TW | 595117 B | 6/2004 |

* cited by examiner

*Primary Examiner* — Aracelis Ruiz

(57) ABSTRACT

An exemplary system of the present disclosure comprises a memory controller, a command bus, a data bus, a memory device and a memory. The memory device is coupled to the memory controller by the command bus and the data bus. The memory stores instructions that when executed by the computer system perform a method of requesting data from the memory device. This method comprises receiving a plurality of commands for the memory device from the command bus, the memory device clocked by a clock. At least one command of the plurality of commands includes a first command and a second command within a single clock cycle of said clock. At least one of the first command and second command is a data access command. The first command is executed during a first clock cycle and the second command is executed during a second subsequent clock cycle.

20 Claims, 7 Drawing Sheets

Conventional Protocol with Burst Length = 1

FIGURE 2B

Conventional Protocol with Burst Length = 2

FIGURE 2C

Conventional Protocol with Burst Length = 4

FIGURE 3A

Conventional Protocol with Burst Length = 1

FIGURE 3B

Protocol with Burst Length = 1

Protocol with Burst Length = 1

EFFICIENT COMMAND MAPPING SCHEME FOR SHORT DATA BURST LENGTH MEMORY DEVICES

TECHNICAL FIELD

The present disclosure relates generally to the field of memory devices and more specifically to the field of memory controllers for short data burst length memory devices.

BACKGROUND

Figure 1:
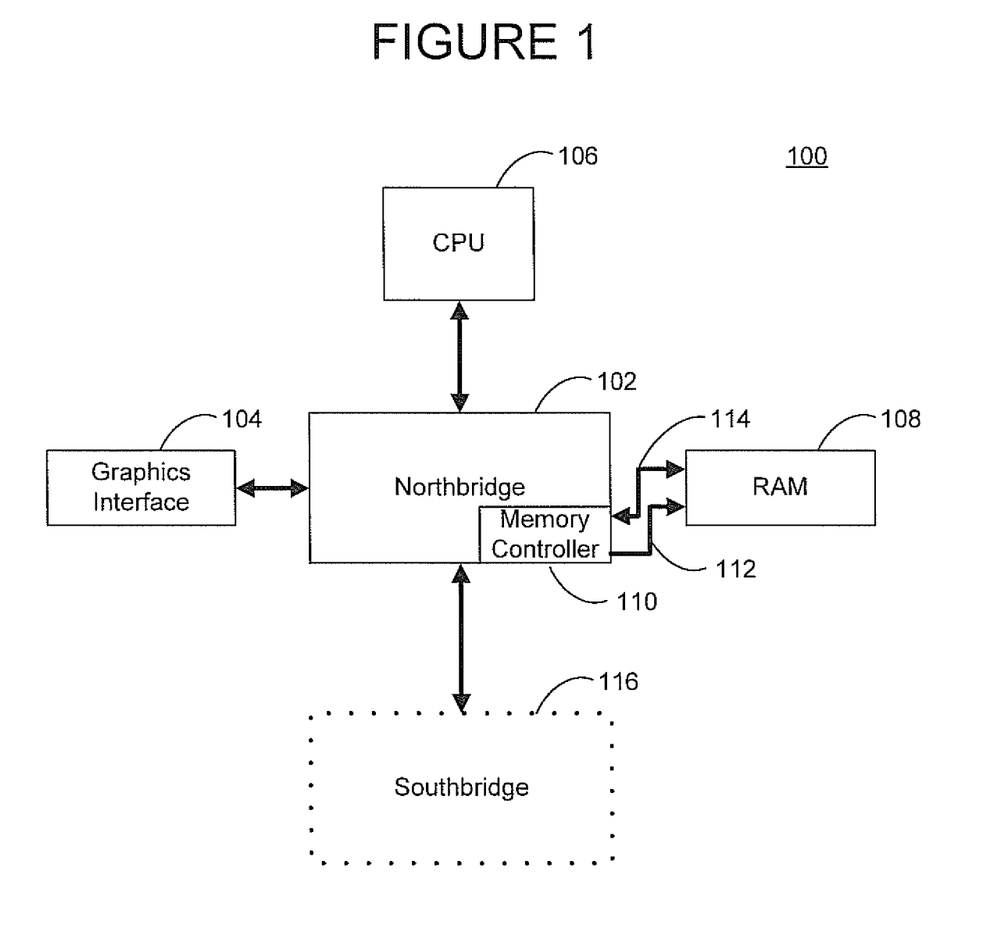
FIG. 1 illustrates an exemplary simplified block diagram of a computer system with a memory controller interconnected to a memory device according to the prior art.

Memory controllers use both a command bus and a data bus for communicating with a memory device. The command bus is used to send address information as well as command instructions for operations such as read, write, activate, and precharge (activate and precharge may also be more commonly known as row/page open or close, respectively). Meanwhile, the data bus is used to transfer read and write data to and from the memory device. Such a memory device and memory controller combination is illustrated in the computer system 100 of FIG. 1. As illustrated in FIG. 1, an exemplary computer system 100 may comprise a Northbridge 102, which is traditionally part of a logic chipset on a motherboard. The Northbridge 102 can either be a separate chip or part of another chip, such as a CPU. The Northbridge 102 may be interconnected with an exemplary graphics interface 104, a CPU 106, and a volatile memory (RAM) 108. In one exemplary embodiment, the memory device 108 can be a dynamic random-access memory (DRAM) that is interconnected to the Northbridge 102 by a memory controller 110. As further illustrated in FIG. 1, the memory controller 110 may be interconnected to the memory device 108 by a command bus 112 and a data bus 114. As further illustrated in FIG. 1, the Northbridge 102 can also be interconnected with a Southbridge 116 that serves to interconnect with other well-known computer interfaces, such as a PCI local bus, USB, ISA buses, IDE interfaces, and etc.

Figure 2A:
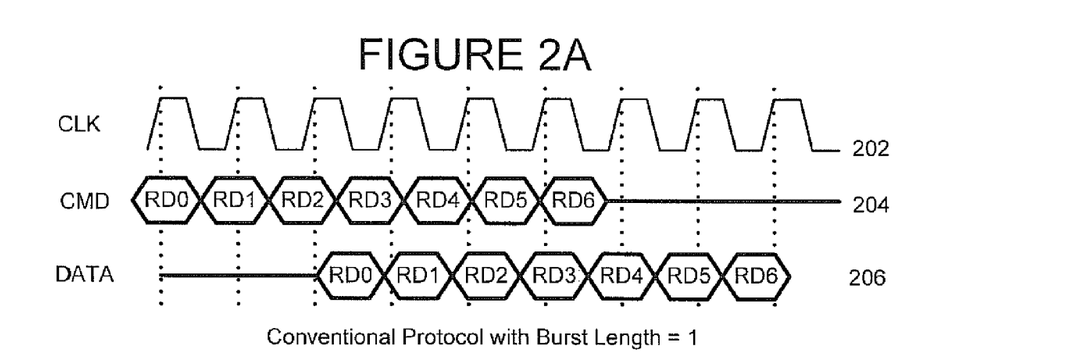
FIG. 2A illustrates an exemplary flow-chart illustrating a 1:1 command-bandwidth-to-data-bandwidth ratio for command and data buses of a memory device according to the prior art.
Figure 2B:
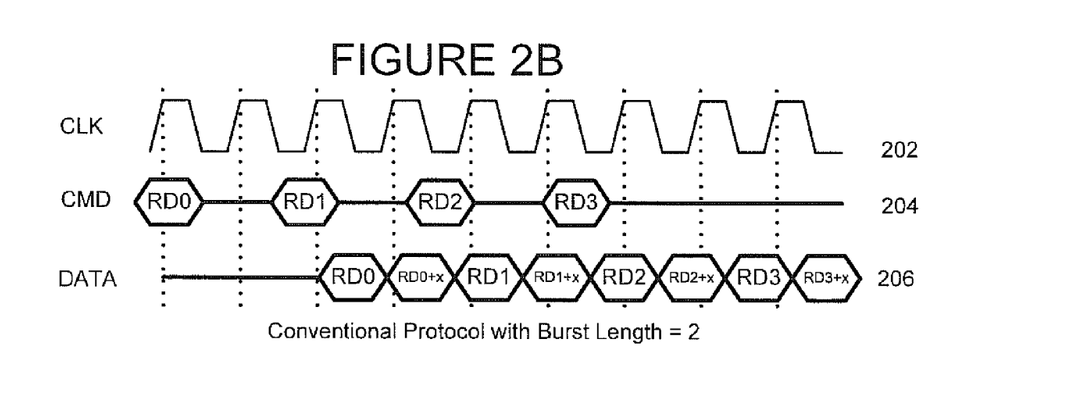
FIG. 2B illustrates an exemplary flow-chart illustrating a 2:1 command-bandwidth-to-data-bandwidth ratio for command and data buses of a memory device according to the prior art.
Figure 2C:
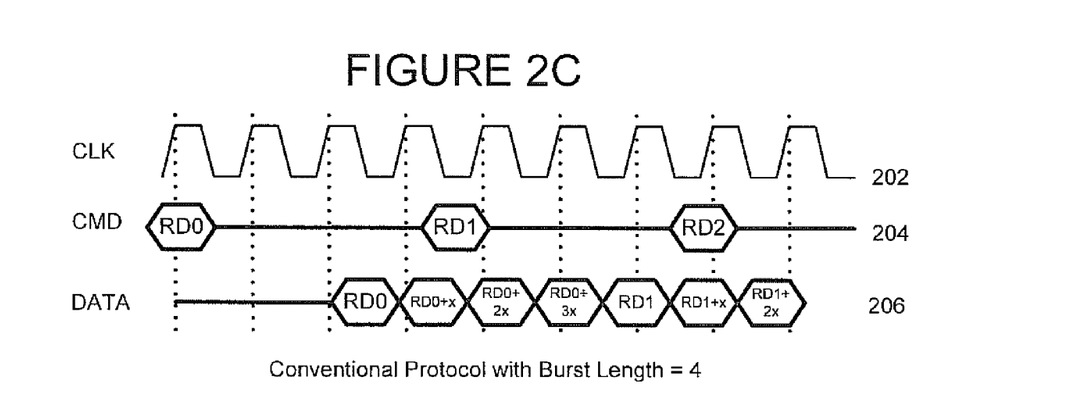
FIG. 2C illustrates an exemplary flow-chart illustrating a 4:1 command-bandwidth-to-data-bandwidth ratio for command and data buses of a memory device according to the prior art.

As illustrated in FIGS. 2A, 2B, and 2C, each command operation issued by the memory controller 110, via the command bus 112, such as a read command, results in a fixed number of data transfers from the memory device 108 to the memory controller 110 via the data bus 114. This fixed number is referred to as the minimum burst length. For example, sDDR2 memory uses a burst length of 4, sDDR3 uses a burst length of 8, and mobile Wide-IO uses a burst length of 2 or 4.

FIG. 2A illustrates a burst length of 1:1, FIG. 2B illustrates a burst length of 2:1, and FIG. 2C illustrates a burst length of 4:1. As illustrated in FIGS. 2A-2C, the burst length defines a command to data bandwidth ratio, where a burst length of 1 means that for every command using a clock cycle of an exemplary 1 ns, the returned data will also use an exemplary 1 ns of time. Therefore, as illustrated in FIG. 2B, a burst length of 2 means that a transmitted command using a clock cycle of 1 ns will see returned data using an exemplary 2 ns of time. Lastly, as illustrated in FIG. 2C, a burst length of 4 means that for every command using a clock cycle of 1 ns, the returned data will use an exemplary 4 ns of time. Or put another way, with a 2:1 ratio, for every clock cycle a command is given, two clock cycles of data are returned, while with a 4:1 ratio, for every clock cycle a command is given, four clock cycles of data are returned.

A typical memory controller 110 sends multiple commands usually greater than one for each data transfer on the bus. This number can go higher than 2 for some multi-rank, closed-page implementations of a memory controller 110. If a number of commands needed to communicate with the memory device 108 becomes larger than the minimum burst length, the effective utilization of the memory interface reduces proportionally. For example, if the command-to-minimum-burst-length ratio is 2:1, as illustrated in FIG. 2B, then every other slot on the data bus will be unutilized, reducing the effective data bandwidth by 50%. As illustrated in FIGS. 2B and 2C, when a read command is issued, the data sent back to the memory controller 110 is dependent upon the minimum burst length. In FIG. 2B, when a read command RD0 is received, the memory device 108 returns not only the requested data at the RD0 address, but also an additional data at an address equal to the RD0 address plus some fixed predefined address offset x (RD0+x). In FIG. 2C, when a read command RD0 is received, the memory device 108 returns not only the requested data at the RD0 address, but also three additional data at addresses equal to the RD0 address plus some fixed predefined address offset x (RD0+x, RD0+2x, and RD0+3x).

In other words, while burst lengths of 2 and 4, or higher, provide additional command bandwidth such that maintenance commands (e.g., pre-charge commands, activate commands, and other commands like refresh and calibration) can be sent while the previous read/write command is being executed without disrupting the data stream, the wide burst length requirements result unfortunately in data inefficiencies as the extra data returned (RD0+x) may not be needed and will be discarded in the memory controller 110.

With the advent of Wide-IO memories with wide 128/256 bit data interfaces, this problem is becoming more severe. To keep the minimum prefetch in check, these devices use small burst lengths of only one or two. However, with current command mapping and a burst length of 1, it is not possible to get a data bus bandwidth utilization comparable to current devices with larger burst lengths. When maintenance commands are sent, a read or write data command cannot be sent and there will be a break in the data stream. As will be discussed herein, such breaks in the data stream due to the necessity of performing maintenance operations can result in up to a 25% loss in data bus bandwidth efficiency for small burst length devices. While higher data bus bandwidth utilization can be achieved by increasing the width of the command interface to allow more commands to be issued, such increases come at the cost of significantly increased pin counts.

SUMMARY OF THE INVENTION

Embodiments of the present invention provide a solution to the challenges inherent in efficiently utilizing the command and data bandwidths between a memory controller and a memory device. Embodiments of the invention reduce the incidence of data bandwidth inefficiencies by receiving two read or write data requests in a single clock cycle that are executed on separate clock cycles such that the second read or write data request execution can coincide with a received maintenance command execution, and thereby allow the data bus to input or output a data block, and avoiding a break in the data stream due to the maintenance command. Such command and data bandwidth efficiency improvements are possible even in command bandwidth and data bandwidth ratios of 1:1 by receiving two data access commands in a single clock cycle to be executed in a first clock cycle and a subsequent second clock cycle.

According to one embodiment of the present invention, a method for requesting data from a memory device is disclosed. This method comprises receiving a plurality of commands for a memory device from a command bus, where the memory device is clocked by a clock. Further, at least one command of the plurality of commands includes two data access commands that are commanded within a single clock cycle of the clock. A first of the two data read or write commands is executed during a first clock cycle. A second of the two read or write commands is then executed during a second subsequent clock cycle. Lastly, results of the two executed commands are communicated to the memory controller via a data bus.

According to one embodiment of the present disclosure, a system comprises a memory controller, a command bus, a data bus, a memory device and a memory. The memory device is coupled to the memory controller by the command bus and the data bus. The memory stores instructions that when executed by the computer system perform a method of requesting data from the memory device. This method comprises receiving a plurality of commands for the memory device from the command bus, the memory device clocked by a clock. Further, at least one command of the plurality of commands includes two read or write data commands within a single clock cycle of said clock. A first of the two data commands is executed during a first clock cycle and a second of the two data access read or write commands is executed during a second subsequent clock cycle. The results of the two executed commands are communicated to the memory controller via the data bus.

In a system according to another embodiment of the present invention, a computer system comprises a memory controller, a command bus, a data bus, and a memory device clocked by a clock. The memory device is coupled to the memory controller by the command bus and data bus. The memory device receives a plurality of commands via the command bus from the memory controller. In at least one command of the plurality of commands, a single command includes a first command and a second command that are received within a single clock cycle of the clock. At least one of the first command and second command comprises a data access command. The data access command when executed by the memory device returns results of the data access command to the memory controller via the data bus. The first command is executed in the memory device during a first clock cycle and the second command is executed in the memory device during a second subsequent clock cycle.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Mapping Schemes for Improved Command and Data Bandwidth Efficiencies in Accordance with Embodiments of the Present Invention:

Embodiments of the present invention provide a solution to the increasing challenges inherent in maintaining high command and data bandwidth efficiencies without increasing the command interface width pin count for memory systems utilizing a command to data bandwidth ratio of 1:1. As discussed in detail below, various embodiments of the present disclosure provide a command mapping scheme that allows a memory controller connected to a memory device with a burst length of 1 to achieve command bus utilization levels equivalent to current interfaces connected to memory devices with higher burst lengths. As discussed in detail below, such higher efficiencies are achieved by repurposing the pins utilized to send a row or page address in the activate command to send a second column address, allowing two column commands to be sent in a single clock cycle. In a typical memory interface, the row address width can be 1.8×-2.0× the column address width. Therefore, as discussed below, a dual column command in the proposed mapping scheme can result in minimal to no increase in pin count.

Figure 3A:
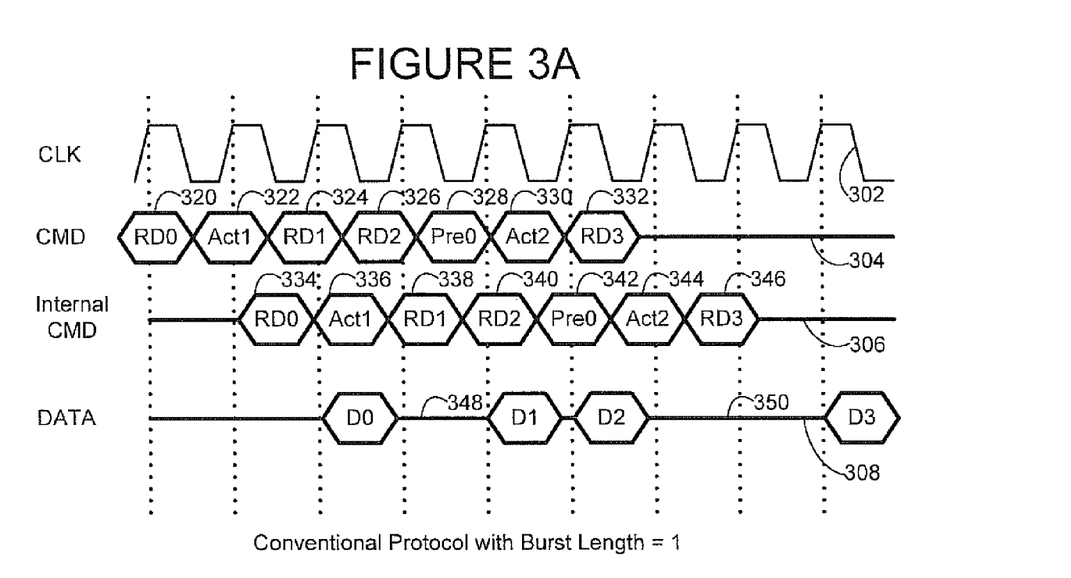
FIG. 3A illustrates an exemplary flow-chart illustrating data bandwidth and command bandwidth efficiencies of a memory device with a 1:1 command to data bandwidth ratio according to the prior art.

As discussed above and illustrated in FIGS. 1, 2A, 2B, and 2C, the memory controller 110 communicates with the memory device 108 with both a command bus 112 and a data bus 114. As also illustrated in FIG. 3A, in a memory device 108 with a burst length of 1, the command bandwidth to data bandwidth ratio is 1:1. Both the command bus 112 and the data bus 114 share a clock and may operate at a same clock rate. For memory devices 108, such as a DRAM, two different types of commands are required to read from or write to the memory device 108. An activate command (also known as a row or page activate command) and a column command are both required. A row-activate command is issued to open a row of memory cells, while a column command is issued to access parts of that opened row. Column commands read or write data, while the pre-charge commands and row-activate commands are maintenance commands. The maintenance commands don't provide data; they provide the memory controller 110 access to the memory device 108. Therefore, to access a particular address in DRAM, a row-activate command may be issued and executed, followed by a required number of column commands for each part of the data requested. A pre-charge command can also be issued to close the row when the operation is completed.

As illustrated in FIGS. 2B and 2C, when a memory device has a data/command bandwidth ratio of 2:1 or 4:1, there can be sufficient command bus bandwidth to handle additional row-activate commands or pre-charge commands while still executing the column commands for the column read or write operation and avoiding a break in the data stream on the data bus 114. Following a traditional mapping scheme for a memory device with a command to data ratio of 1:1, when a column command is issued and executed, the single block of data as addressed in the column command can be returned. However, if a new row needs to be selected with a row-activate command or a pre-charge command needs to be issued, there is no place to place the row-activate command without breaking the data stream as illustrated in FIG. 3A.

Exemplary 1:1 Ratio Mapping Scheme Using Conventional Methods:

FIG. 3A illustrates an exemplary flow chart for a conventional mapping scheme with a burst length of 1 and a command to data bandwidth ratio of 1:1. A exemplary clock signal 302 synchronizes the command bus 112 and data bus 114. Commands 304 are sent down the command bus 112 to be received and executed by the memory device 108. As illustrated in FIG. 3A, the commands issued by the memory controller 110 can comprise read commands (RD0, RD1, RD2, and RD3) 320, 324, 326, and 332 which are implemented with the above described column commands, row-activate commands (Act1 and Act2) 322, 330 for opening pages or rows in the memory device 108, pre-charge commands (Pre0) 328 for closing pages or rows in the memory device 108, and no-operation commands (NOP) used when there is to be no command executed in the current clock cycle.

Therefore, as illustrated in FIG. 3A, with each clock cycle 302, a command 304 is issued from the memory controller 110 to the memory device 108 via the command bus 112. FIG. 3A illustrates an exemplary chain of 7 issued commands: RD0 320, Act1 322, RD1 324, RD2 326, Pre0 328, Act2 330, and RD3 332. These issued commands 304 are received and executed 306 by the memory device 108. As illustrated in FIG. 3A, as a row-activate command 336 is executed after the first read command 334, there will be a break 348 in the data stream 308. After the one clock cycle break 348 in the data stream 308, the second and third read commands 338, 340 are executed, followed by a pre-charge command 342 and a second row-activate command 344, with this exemplary chain of commands concluding with a fourth read command 346, resulting in a break 350 in the data stream 308 of two clock cycles between the results of the third and fourth read commands 340, 346.

Figure 3B:
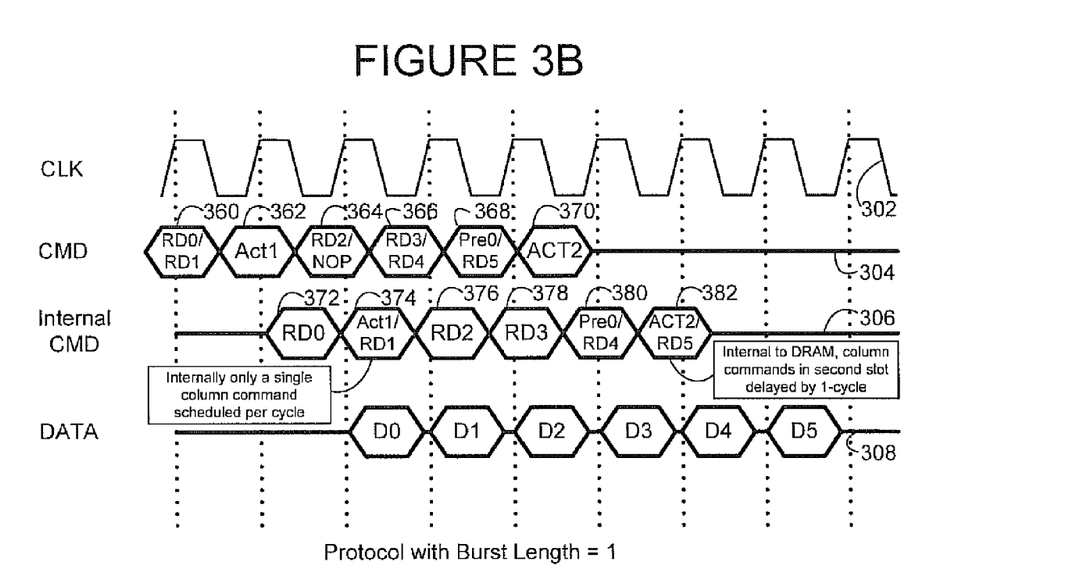
FIG. 3B illustrates an exemplary flow-chart for providing improved data bandwidth and command bandwidth efficiencies of a memory device with a 1:1 command to data bandwidth ratio in according with an embodiment of the present invention.

As illustrated in FIG. 3B, whenever there is a row-activate command or some other maintenance command to be scheduled, the memory controller schedules the queuing commands such that prior to the maintenance command, a pair of commands will be issued in a single clock cycle. As illustrated in FIG. 3B, while a first command of the pair of commands, can be a maintenance command (e.g., a no operation command or a precharge command) or a data read or write command, the second command will usually be a data read or write command. If the first command is a data read or write command, the second command, if a data access is required, will be a matching data read or write command. In other words, in exemplary embodiments, when the second command is a data access command (e.g. a read or write command) that is to be delayed one clock cycle, the first command can be any command that leaves sufficient input pins to allow the second command to be received as well. For example, the first command can be a data read command, a data write command, a no operation command, or a precharge command, while the second command will usually be a corresponding data read command or data write command. Such a pair of read commands (issued as column commands, as described herein) (RD0/RD1) 360 is found in the first command issued 304 from the memory controller 110. The first read command (RD0) is to be executed immediately, with the second read command (RD1) of the first command 360 executed after a delay of one clock cycle. Whatever command is placed into the second slot of the dual-commands, illustrated in FIG. 3B, is executed after a one clock cycle delay. As also illustrated in FIG. 3B, and discussed above, a pair of commands issued in a single clock cycle can also include a precharge command (Pre0) and a data read command (RD5) 368. As also discussed above and below, the data read command RD5 of the pair of commands 368 can also be a write command.

A Mapping Scheme for Improved Command and Data Bandwidth Efficiencies in Accordance with Embodiments of the Present Invention:

As illustrated in FIG. 3B, with each clock cycle 302, a command 304 is issued from the memory controller 110 to the memory device 108 via the command bus 112. FIG. 3B illustrates an exemplary chain of 7 commands: RD0/RD1 360, Act1 362, RD2/NOP 364, RD3/RD4 366, Pre0/RD5 368, and Act2 370. Each of the commands in FIG. 3B is paired up with a second command except for the row-activate commands 362, 370 which use all of the command interface pins. While a pair of commands 360-370 can be issued in a single clock cycle, only a single command of the pair of commands will be executed at a time, with the second command to be "posted" to a next clock cycle. This "posted" command ensures that only a single data access command is executed in a clock cycle. As discussed herein, the data access commands can be data read commands or data write commands.

Therefore, in response to the exemplary command chain illustrated in FIG. 3A, the following commands are executed. In a first executed command 306, the first read command (RD0) 372 is executed, followed by the first row-activate command (Act1) and the second read command (RD1) 374 executed next. In a third executed command 306, the third read command (RD2) 376 is executed. In a fourth executed command 306, the fourth read command (RD3) 378 is executed. In a fifth executed command 306, a first pre-charge command (PRE0) and a fifth read command (RD4) 380 are executed. Lastly, in a sixth executed command 306, a second row-activate command (Act2) and a sixth read command (RD5) 382 are executed. As each command or pair of commands is executed, a read command (or write command in other embodiments) is able to be scheduled for execution with each clock cycle. With a read command executed in each clock cycle, as illustrated in FIG. 3B, a continuous stream of data 308 is produced that is filled with only requested data, such that no received data blocks (D0-D5) of the data stream 308 are discarded by the memory controller 110.

Figure 4:
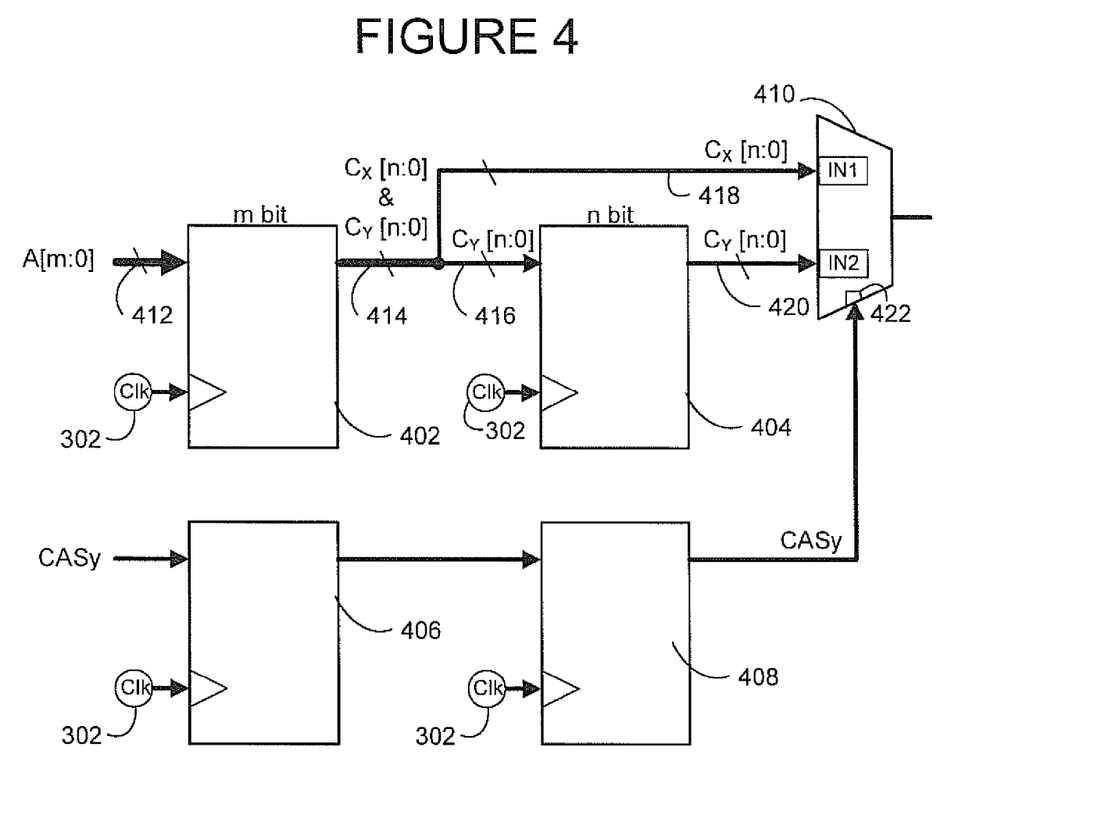
FIG. 4 illustrates an exemplary simplified block diagram of a computer controlled system for selecting one of two column address commands received for execution in a memory device in accordance with an embodiment of the present invention.

As illustrated in FIG. 4, and described in detail below, the first and second column commands from a dual column command (which provide the column address for a desired memory cell) executed for a read operation are received by a pair of flip-flops before execution by column decoders of the memory device 108. As noted above, a row-activation command can require a higher pin count (e.g. 20 bits for an address) while a column command can be only 9-10 bits for an address. Therefore, since a row-activate command can require 18-22 bits and a column command can require only 10-11 bits, there are enough unused bits in a traditional memory address bus to allow the issuance of a second column command in a single clock cycle by repurposing some of the bits/pins used for a row-activate command. While a first exemplary column command $C_X$ (a "n" bit command) is received using the traditional address command pins, the second exemplary column command $C_Y$ (also a "n" bit command) is received using a portion of the "m" row-activate address pins. These two column commands ($C_X$ & $C_Y$) as illustrated in FIG. 4, are carried on wires 412 into the first "m"-bit flip-flop 402. Upon receiving a clock edge of the clock signal 302 (which can be either a rising or falling edge of the clock signal 302), the first flip-flop 402 outputs the two column commands ($C_X$ & $C_Y$) which are then immediately split off, with the first column command ($C_X$) continuing on wires 418 to an input (IN1) of a multiplexer 410, and the second column command ($C_Y$) continuing on to a second "n"-bit flip flop 404. As illustrated in FIG. 4, the output of the second flip flop 404, after receiving a clock edge 302, is communicated via wires 420 to a second input (IN2) of the multiplexer 410.

The verification signal CASy, received at the control input 422 of the multiplexer 410, as illustrated in FIG. 4, will determine which column command ($C_X$ or $C_Y$) received at the inputs (IN1 & IN2) of the multiplexer 410 will be executed. While the first column command ($C_X$) is received at the multiplexer 410 after being released from the first flip flop 402, the second column command ($C_Y$) is held by the second flip flop 404 for a one clock cycle delay before also arriving at the multiplexer 410. As also illustrated in FIG. 4, the verification signal CASy can also be sent through a first flip flop 406 and a second flip flop 408, such that when the first column command ($C_X$) reaches the multiplexer 410, the verification signal CASy received with the dual column commands is still waiting at the second flip flop 408 for another clock cycle. Therefore, when the first column command ($C_X$) reaches the first input (IN1) of the multiplexer 410, it will be selected, as the current verification signal CASy will not be present at the multiplexer 410. Without the current verification signal CASy present at the multiplexer 410, the control input 422 of the multiplexer 410 will be low, selecting the first input IN1. After the one clock cycle delay, the second column command ($C_Y$) is released to the second input (IN2) of the multiplexer 410 along with the verification signal CASy, received at the control input 422. Therefore, with the current verification signal CASy now driving the control input 422 high, the second column command ($C_Y$) also newly arrived at the second input (IN2) of the multiplexer 410 will be selected by the multiplexer 410 for execution. Therefore, with the second column command ($C_Y$) at the multiplexer 410, a maintenance command (e.g., a row-activation, a pre-charge or a no-operation command) can also be executed along with the column command, as illustrated in FIG. 3B, such that a read operation can be completed each clock cycle along with any necessary maintenance commands.

In another embodiment, the verification signal CASy may be received by the same flip flops 402 and 404 as the first and second column commands ($C_X$ & $C_Y$). Such an integrated embodiment may replace the original "m"-bit flip flops with "m+1"-bit flip flops or some other bit size as desired.

Figure 5:
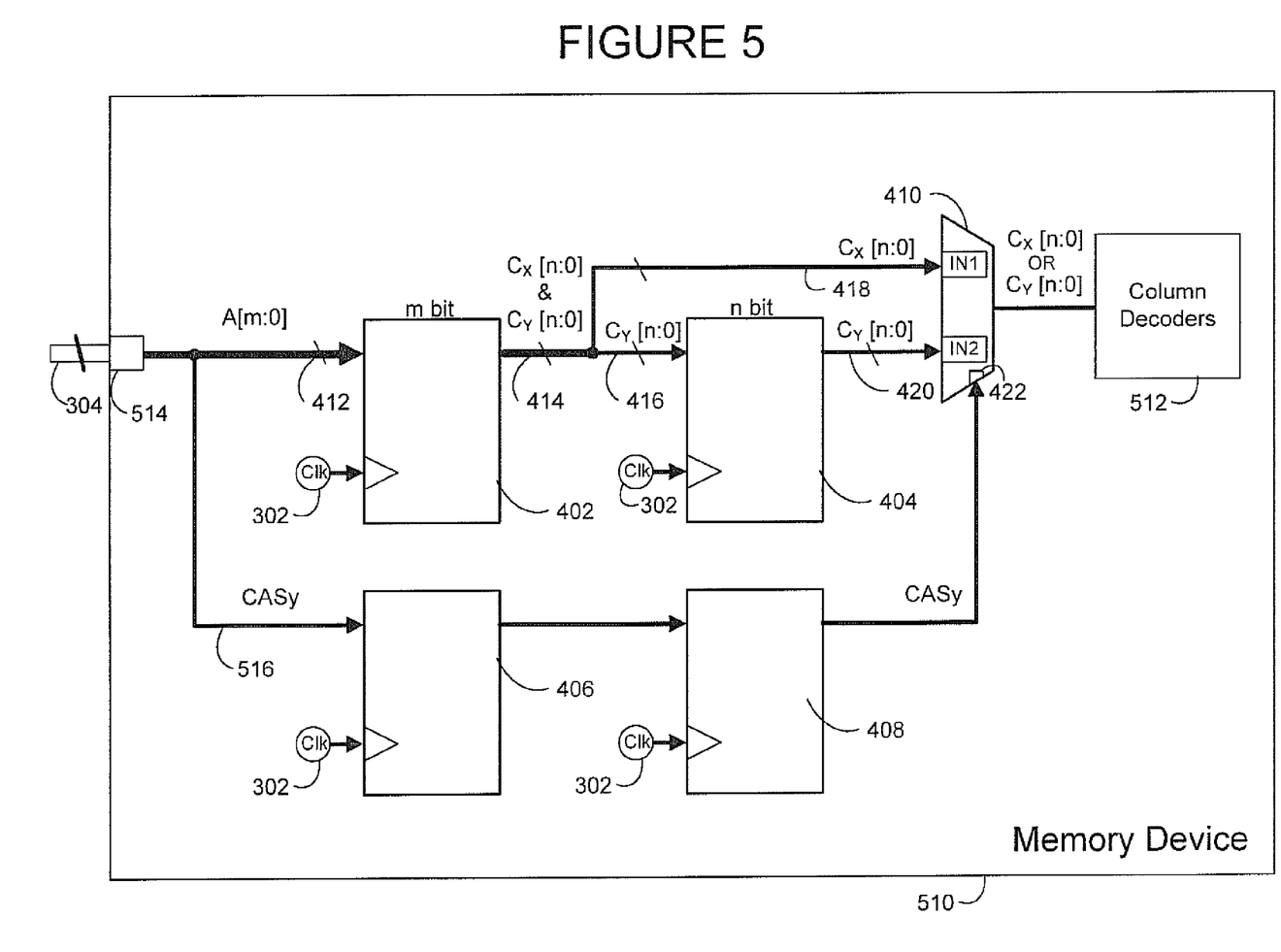
FIG. 5 illustrates an exemplary simplified block diagram of a memory device and a computer controlled system for selecting one of two column address commands received for execution in a memory device in accordance with an embodiment of the present invention.

The flip flop circuitry of FIG. 4 can be implemented as illustrated in FIG. 5. Here in an exemplary embodiment, the flip flop circuitry of FIG. 4 is implemented in a memory device 510. As illustrated in FIG. 5, the output of the multiplexer 410 is input to column decoders 512 for execution of an exemplary read command as determined by the column address in column address $C_X$ or $C_Y$. As further illustrated in FIG. 5, the stream of commands 304, as issued by the memory controller 110, is received by the memory device 510, and those pins of the interface 514 containing the pins for the two column commands ($C_X$ & $C_Y$) and the verification signal CASy are communicated to the flip flop circuitry 402-408 and multiplexer 410 for eventual execution in the column decoder 512 of the memory device 510.

Figure 6:
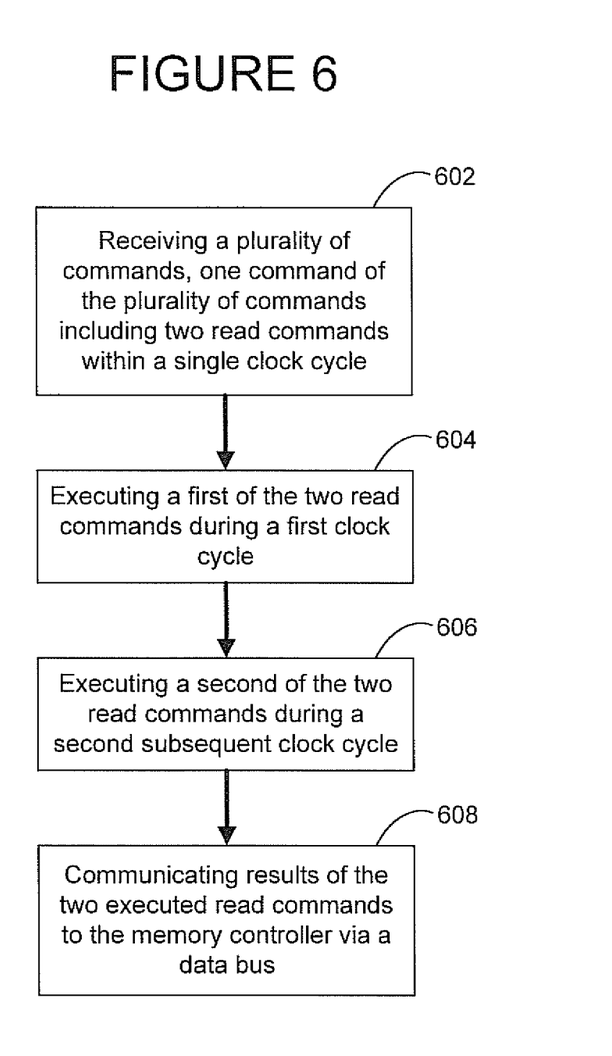
FIG. 6 illustrates an exemplary flow diagram of a method of controlling a memory device in accordance with an embodiment of the present invention.

An exemplary method for optimal command mapping in short data burst length devices is illustrated in FIG. 6. In step 602 of FIG. 6, a plurality of commands is received at a memory device 108 from a memory controller 110, via a command bus 112. In at least one of the received commands, a plurality of commands including two read or write data commands within a single clock cycle will be included. As discussed above, the two commands received can be any two commands, with at least one of the two commands a column command (as a read command). However, as also discussed above, a column command and a row-activate command will not be received in a single clock cycle.

In step 604 of FIG. 6, a first of the two data read or write commands will be executed in a first clock cycle. Then in step 606 of FIG. 6, a second of the two read or write commands will be executed in a second subsequent clock cycle. Lastly, in step 606 of FIG. 6, the results of the two executed commands (as determined by the executed column commands which contained the column addresses of the desired data) will be communicated to the memory controller 110 via a data bus 114.

Embodiments of the present invention are applicable for any memory device that is running out of command bandwidth. By issuing two column commands in a single clock cycle of the command bus through the repurposing of a part of the row-activate pins that are not being used in a column command, breaks in the data stream can be avoided. Further, embodiments of the present invention can also provide improved command and data bandwidth efficiencies as the data sent on the data bus 110 can be data that was expressly requested, eliminating the inefficiencies of mapping schemes that require the reading or writing of unneeded data that is communicated on the data bus to be discarded. For example, a 2:1 ratio memory device under traditional mapping schemes would send the memory controller a first requested block of data and a second unneeded block of data as determined by $C_X$+x. Implementations of the present invention allow the memory controller to ask for $C_X$ and $C_Y$ instead of $C_X$ and $C_X$+x.

Issuing two commands within a single clock cycle is also an improvement over mapping schemes that allow the use of "Additive Latency." Additive latency allows a column command to be delayed a set amount of time (some number of clock cycles). Such a delay would allow a row-activate command to be executed along with a previously requested but delayed column command. It allows the postponement of a command to prevent command conflicts. It is most often used with memory devices with plenty of command bandwidth (command bandwidth to data bandwidth ratios of 2 or more) to prevent timing conflicts because of conflicting column or maintenance commands. However, a column command can only be delayed with Additive Latency between reads and writes, but not between reads and reads and writes and writes, unlike embodiments of the present invention, which allow an additional command to be paired with a command.

Current mapping schemes may be able to avoid breaks in the data stream during read operations by having additional command bandwidth by going with a 2:1 or 4:1 ratio or greater, but at the expense of increased granularity. Even if only an exemplary 32 bits of data was requested in an exemplary memory system having a 128 bit data bus bandwidth, a full 128 bits of data would have be sent on the data bus in response to the read operation. As noted above, the additional data received by the memory controller that was provided due to the constraints of the memory device (with 2:1 or 4:1 ratios for example) would be discarded.

As noted above, the flip-flop circuitry 402-408 and multiplexer 410 of FIG. 4 are the only changes needed to a memory device to implement the issuing of dual commands in a single clock cycle. Therefore, the addition of extra pins or complex additional logic to execute this new mapping scheme can be avoided. Further, embodiments of the present invention are backwards compatible. If such a memory device was to be run utilizing a traditional mapping scheme in a 2:1 ratio environment, an exemplary column command can be sent that results in column addresses of $C_X$ and a second predetermined column address of $C_X$+x by driving the verification signal CASy to low and keeping it there. With the verification signal CASy kept low, the multiplexer will only ever allow the first column command ($C_X$) through. By alternatively holding the verification signal CASy low or allowing the verification signal CASy to fluctuate according to the type of command operations that are received (as noted above, the only time the verification signal CASy will ever go high is when a second command has been received in the above described dual-command mapping scheme), a multi-mode memory controller can be provided.

While for the sake of simplicity, the exemplary embodiments have primarily comprised read operations using column commands to address the desired data locations, the present invention is equally effective for write operations using the same column commands. The data bus 114 of FIG. 1 is bidirectional and the memory controller 110 can either receive data in response to read operations sent to the memory device 108, or drive data to the memory device 108 via the data bus 114 in conjunction with write commands sent via the command bus 112. In such a write operation, the write command may also use the column commands to select a particular address in the opened row/page for the write operation. Just as in read operations, if the above described dual-commands (for example a first column command ($C_X$) and a second column command ($C_Y$) received in a single clock cycle) are not utilized, then there will be similar breaks in the write data driven by the memory controller 110 to the memory device 108, as the associated write data will not be driven on the data bus 114 until the write operation command is issued on the command bus 112.

Figure 7:
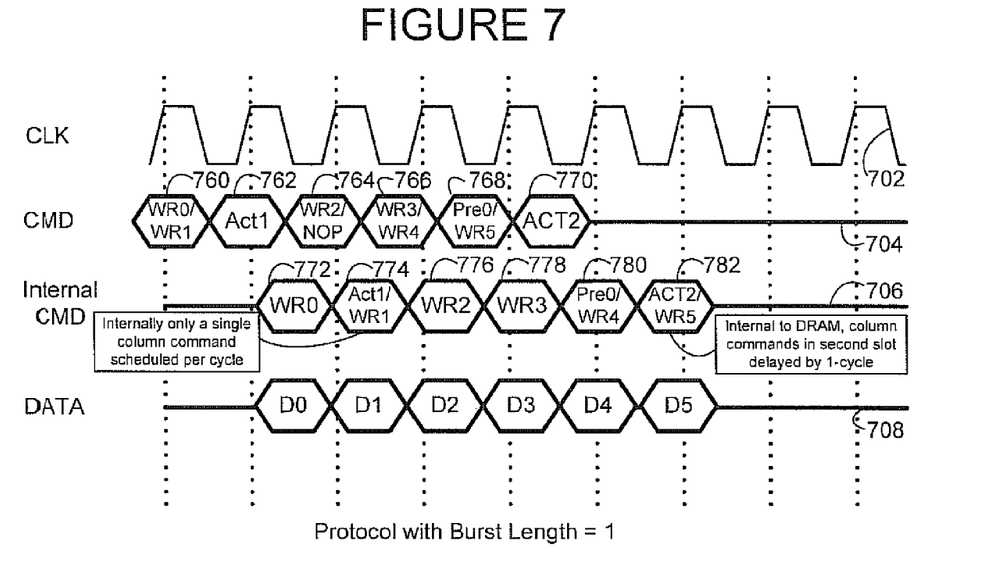
FIG. 7 illustrates an exemplary flow-chart for providing improved data bandwidth and command bandwidth efficiencies of a memory device with a 1:1 command to data bandwidth ratio in accordance with an embodiment of the present invention.

An embodiment of the present invention, illustrated in FIG. 7, is similar to FIG. 3B, but with the read commands replaced with write commands. As illustrated in FIG. 7, with each clock cycle 702, a command 704 (e.g., pairs of commands 760-770, except for activate commands which are issued by themselves) is issued from the memory controller 110 to the memory device 108 via the command bus 112. As also illustrated in FIG. 7, the data stream 708 has switched directions from that illustrated in FIG. 3B, with the memory controller 110 issuing write commands (WR0-WR5) 760, 764, 766, and 768 and their corresponding data (D0-D5) in the data stream 708. Similar to FIG. 3B, the "posted" or delayed data write commands (i.e., the second command in a pair of commands) are paired with a data write command or a maintenance command as illustrated in command pairs 760 and 768, respectively, where the first command, a data write command (WR0) of command pair 760 and a precharge command (Pre0) of command pair 768 are executed first, followed by the write command (WR1) of the command pair 760 and the write command (WR5) of the command pair 768, respectively, a clock cycle later.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method of memory controller operation, the method comprising:
    receiving a plurality of commands for a memory device from a command bus, the memory device clocked by a clock, wherein at least one command of the plurality of commands comprises a first command and a second command received within a single clock cycle of said clock, wherein the memory device executes no more than one data access command each clock cycle;
    executing the first command during a first clock cycle;
    executing the second command during a second subsequent clock cycle, wherein the second command is a data access command; and
    communicating results of the executed data access command to the memory controller via a data bus, wherein the command bus comprises bit lines for receiving a column command and a row-activate command at the memory device, and wherein the second command utilizes at least one bit line of the bit lines for receiving a row-activate command.

2. The method of claim 1, wherein the data access command is a data read command.

3. The method of claim 2, wherein the data access command is a data write command, wherein the data write command invokes writing data in the memory device from the data bus as determined by the memory controller.

4. The method of claim 3, wherein the plurality of commands comprises data read commands, data write commands, row-activate commands, and pre-charge commands, and wherein data read commands and data write commands comprise column addresses, and wherein the first command comprises one of a data read command, a data write command, and a pre-charge command.

5. The method of claim 4, wherein the second command is executed when a verification signal is received at the memory device.

6. The method of claim 1, wherein a command bandwidth to data bandwidth ratio for the memory device is 1:1.

7. The method of claim 1, wherein the executing the second command during the second subsequent clock cycle comprises:
    delaying the execution of the second command one clock cycle; and
    executing the second command on a next clock cycle after the first clock cycle.

8. The method of claim 1, further comprising:
    executing one of a pre-charge command and a row-activate command during the second subsequent clock cycle, wherein the one of the pre-charge command and the row-activate command is received during a. clock cycle subsequent to receiving the first command and the second command.

9. A computer system comprising:
    a memory controller;
    a command bus and a data bus;
    a memory device coupled to the memory controller by the command bus and the data bus; and
    a memory for storing instructions, that when executed by the computer system perform a method of requesting data from the memory device, the method comprising:
        receiving a plurality of commands for a memory device from a command bus, the memory device clocked by a clock, wherein at least one command of the plurality of commands comprises a first command and a second command received within a single clock cycle of said clock, wherein the memory device executes no more than one data access command each clock cycle;
        executing the first command during a first clock cycle;
        executing the second command during a second subsequent clock cycle,
    wherein the second command is a data access command; and
        communicating results of the executed data access command to the
    memory controller via a data bus, wherein the command bus comprises hit lines for receiving a column command and a row-activate command at the men/or device, wherein the second command utilizes at least one bit line of the bit lines for receiving a row-activate command.

10. The computer system of claim 9, wherein the data access command is a data read command.

11. The computer system of claim 10, wherein the data access command is a data write command, and wherein the data write command invokes writing data in the memory device from the data bus as determined by the memory controller.

12. The computer system of claim 11, wherein the plurality of commands comprises data read commands, data write commands, row-activate commands, and pre-charge commands, wherein data read commands and data write commands comprise column addresses, and wherein the first command comprises one of a data read command, a data write command, and a pre-charge command.

13. The computer system of claim 9, wherein a command bandwidth to data bandwidth ratio for the memory device is 1:1.

14. The computer system of claim 13, wherein the second command is executed when a verification signal is received at the memory device.

15. The computer system of claim 9, wherein the executing the second command during the second subsequent clock cycle comprises:
    delaying the execution of the second command one clock cycle; and
    executing the second command on a next clock cycle after the first clock cycle.

16. The computer system of claim 9, wherein the method further comprises:
    executing one of a pre-charge command and a row-activate command during the second subsequent clock cycle, wherein the one of the pre-charge command and the row-activate command is received during a clock cycle subsequent to receiving the first command and the second command.

17. A computer system comprising:
    a memory controller;
    a command bus and a data bus; and
    a memory device clocked by a clock and coupled to the memory controller by the command bus and the data bus, wherein the memory device is operable to receive via the command bus a plurality of commands from the memory controller, wherein at least one command of the plurality of commands comprises a first command and a second command received within a single clock cycle of the clock that when executed by the memory device communicates the results of the two commands to the memory controller via the data bus, wherein at least one of the first command and the second command comprises a read command, wherein the memory device is operable to execute no more than one data access command each clock cycle, wherein the first command is operable to be executed in the memory device during a first clock cycle and the second command is operable to he executed in the memory device during a second subsequent clock cycle, and wherein the command bus comprises bit lines for receiving a column command and a row-activate command at the memory device, wherein the second command utilizes at least one bit line of the bit lines for receiving a row-active command.

18. The computer system of claim 17, wherein a command bandwidth to data bandwidth ratio for the memory device is 1:1.

19. The computer system of claim 17, wherein the second command is executed when a verification signal is received at the memory device.

20. The computer system of claim 17, wherein at least one of the first command and the second command comprises a write command that when executed by the memory device writes data into the memory device from the data bus as determined by the memory controller.

* * * * *